US 6,506,684 B1

United States Patent
Daniel et al.

(10) Patent No.: US 6,506,684 B1
(45) Date of Patent: Jan. 14, 2003

(54) ANTI-CORROSION SYSTEM

(75) Inventors: David W. Daniel, Vancouver, WA (US); Dodd C. Defibaugh, Camas, WA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/577,912

(22) Filed: May 24, 2000

(51) Int. Cl.$^7$ .............................................. H01L 21/302
(52) U.S. Cl. ...................... 438/706; 438/745; 438/754; 134/1.3
(58) Field of Search ................................ 438/706, 720, 438/745, 746, 749, 754; 134/1, 1.1, 1.3, 1.2, 2, 6

(56) References Cited

U.S. PATENT DOCUMENTS

| 5,174,816 A | * | 12/1992 | Aoyama et al. ............ 106/203 |
| 5,412,868 A | * | 5/1995 | Nguyen et al. ............... 29/852 |
| 5,612,304 A | * | 3/1997 | Honda et al. ............... 510/176 |
| 5,704,987 A | * | 1/1998 | Huynh et al. .................. 134/6 |
| 5,783,495 A | * | 7/1998 | Li et al. ...................... 438/738 |
| 6,211,127 B1 | * | 4/2001 | Kim et al. ................... 510/176 |
| 6,235,145 B1 | * | 5/2001 | Li et al. ...................... 438/706 |

FOREIGN PATENT DOCUMENTS

| JP | 59090850 | * | 5/1984 | ........... G03C/11/00 |
| JP | 62281332 A | * | 12/1987 | ......... H01L/21/302 |

OTHER PUBLICATIONS

Wolf et al., Silicon Processing for the VLSI Era, 1986, vol. 1, p. 518.*

* cited by examiner

Primary Examiner—Benjamin L. Utech
Assistant Examiner—Duy-Vu Deo
(74) Attorney, Agent, or Firm—Luedeka, Neely & Graham, PC

(57) ABSTRACT

A method for etching a surface of an integrated circuit. A layer of photoresist is applied to the surface of the integrated circuit. The layer of photoresist is exposed and developed, and the surface of the integrated circuit is etched with an etchant that contains chlorine. The surface of the integrated circuit is exposed to tetra methyl ammonium hydroxide to neutralize the chlorine, and rinsed with water.

20 Claims, 2 Drawing Sheets

ANTI-CORROSION SYSTEM

FIELD

This invention relates to the field of integrated circuit processing. More particularly the invention relates to a system for removing chlorine from process materials.

BACKGROUND

The method by which integrated circuits are manufactured is, in its simplest form, a series of general process steps that are repeated over and over again until the several layers that comprise an integrated circuit have been formed. These steps generally include depositing a layer of material, applying photoresist on top of the deposited layer, patterning the photoresist, etching the deposited layer in those areas where the patterned photoresist has been removed, and then removing the photoresist to expose the patterned deposited layer.

Many of the etchants used to etch the deposited layer contain chlorine. Chlorine is a preferred constituent of etchants because chlorine tends to be a relatively reactive material. Chlorine tends to exist in an ionized state in aqueous solutions such as aqueous etchant solutions. Further, gaseous chlorine compounds tend to dissociate easily, which again produces relatively reactive chlorine ions. The reactive chlorine ions rigorously attack the deposited material in those areas where the patterned photoresist has been removed. This results in an etching process that proceeds at a relatively fast rate.

Unfortunately, even though the integrated circuits are typically rinsed with water following an etching process, this mechanical rinsing action tends to leave some of the chlorine from the etchant on the exposed surfaces of the integrated circuit. Because the chlorine tends to be a reactive material, as described above, the residual chlorine tends to cause problems with the integrated circuit. For example, the chlorine can continue to etch the materials of the integrated circuit. Even though such continued etching may proceed at a very slow rate due to the small amount of chlorine that is left behind, this situation reduces the reliability and utile life of the integrated circuit.

By further example, the residual chlorine, especially in the presence of water, whether that water be from humidity in the air or an aqueous solution, can enable galvanic reactions and other corrosive reactions in and between metallic layers on the integrated circuit. For example, in an aluminum layer, chlorine can react with the aluminum according to the following reactions:

$$Al+3Cl=AlCl_3 \quad 2AlCl_3+3H_2O=Al_2O_3+6HCl \quad Al+HCl=AlCl_3$$

The reactions according to the above equations tend to proceed until various conditions, such as material availability, reaction kinetics, and thermodynamics, inhibit them. Thus, according to these equations, a deposited aluminum layer, such as a conduction layer, is corroded to aluminum oxide and other byproducts.

What is needed, therefore, is a system for more fully removing or otherwise neutralizing the residual chlorine that may exist on an integrated circuit, without otherwise chemically or mechanically impairing the functional layers of the integrated circuit.

SUMMARY

The above and other needs are met by a method for etching a surface of an integrated circuit. A layer of photoresist is applied to the surface of the integrated circuit. The layer of photoresist is exposed and developed, and the surface of the integrated circuit is etched with an etchant that contains chlorine. The surface of the integrated circuit is exposed to tetra methyl ammonium hydroxide to neutralize the chlorine, and rinsed with water.

The benefit of a method according to the present invention is that the tetra methyl ammonium hydroxide does not just mechanically remove the chlorine, such as is accomplished by a rinse, but also chemically neutralizes the chlorine, such as according to the following reaction:

$$HCl+(CH_3)_4NOH=H_2O+(CH_3)_4NCl$$

Without being bound by theory, reactions such as this tend to preferentially bind the chlorine, thus making it unavailable for the galvanic and other corrosive reactions that are detrimental to the deposited layers of the integrated circuit, such as those reactions given above.

Further, tetra methyl ammonium hydroxide does not unfavorable react with the other components and chemistries of the integrated circuit. Tetra methyl ammonium hydroxide is also used in other aspects of integrated circuit processing, such as in developing photoresist. However, tetra methyl ammonium hydroxide has not previously been used after an etch step to neutralize chlorine and other halogens.

In various preferred embodiments of the invention, the step of exposing the surface of the integrated circuit to tetra methyl ammonium hydroxide is accomplished by rinsing the surface of the integrated circuit with an aqueous solution of tetra methyl ammonium hydroxide. Similarly, the surface of the integrated circuit can be exposed to a gas containing tetra methyl ammonium hydroxide, or a gaseous form of tetra methyl ammonium hydroxide.

The step of exposing the surface of the integrated circuit to the tetra methyl ammonium hydroxide can be accomplished either prior to, concurrently with, or after an additional step of removing the layer of photoresist from the surface of the integrated circuit. The photoresist can be removed by ashing in an oxygen plasma or an ozone plasma.

In one embodiment of the invention, the steps of etching the surface of the integrated circuit, exposing the surface of the integrated circuit to tetra methyl ammonium hydroxide, and removing the layer of photoresist from the surface of the integrated circuit are accomplished in separate chambers of a multichamber tool. In a further related embodiment, the step of rinsing the integrated circuit with water is accomplished in the same chamber as that used to expose the integrated circuit to the tetra methyl ammonium hydroxide.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
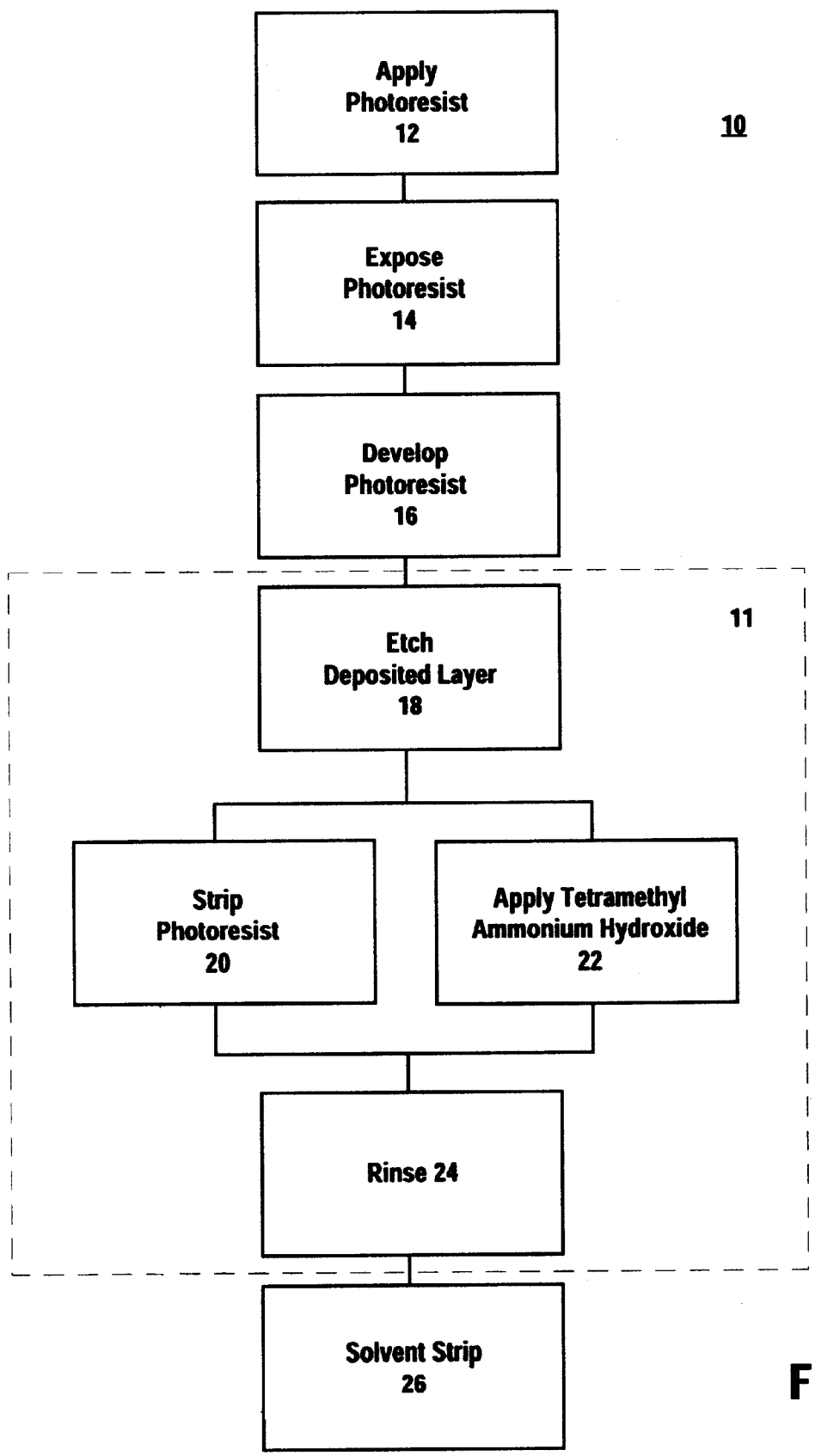
FIG. 1 is a flow diagram depicting some of the major steps of a method according to the present invention.

Referring now to FIG. 1, there is depicted a flow chart for a preferred procedure 10 according to the present invention.

The first step in the procedure 10 is to apply the photoresist as in step 12. The photoresist overlies a deposited layer on the integrated circuit that is to be patterned. While the method as described below is applicable for a wide variety of deposited layers, there is particular benefit when the deposited layer is a metallic layer, such as aluminum. These particular benefits are described in more detail below.

The photoresist is exposed as in step 14. During the exposure of the photoresist, an image is transferred to the photoresist, such as from a mask. The image corresponds to the pattern that is desired for the deposited layer. The photoresist is developed as in step 16. Typically, there is additional processing that is accomplished in association with those major steps described above. However, the major steps described above are sufficient to provide a reference for the more detailed steps of the method, as described below.

Once the photoresist is developed, the desired image has been transferred to the photoresist. In other words, portions of the deposited layer of photoresist remain atop the deposited layer that is to be patterned, and portions of the photoresist layer have been removed. When the integrated circuit is etched as in step 18, those portions of the deposited layer that are to be removed during etch, which underlie the removed portions of the photoresist layer, are exposed to the etchant. The etchant may be either aqueous, such as an acid, or gaseous, which may be further enhanced such as by a plasma. Although there are many different types of etchant systems, the present invention has particular applicability to halogen containing etchant systems, such as those that contain various chlorine compounds.

The next two steps 20 and 22 of the method 10 as given in FIG. 1 are depicted side-by-side because they can be accomplished either in a serial fashion, with either one of the steps performed before the other, or concurrently.

During the photoresist strip step 20, the photoresist that was left on the integrated circuit after the develop step 16, and which was used to pattern the underlying deposited layer during the etch step 18, is removed. The photoresist strip is accomplished according to one or more of a variety of methods, such as chemical strip or plasma ashing. In a most preferred embodiment of the invention, the photoresist strip is accomplished with either an oxygen ashing or ozone ashing process. In these processes, a plasma is ignited using either oxygen or ozone as a precursor gas. The oxygen in the precursor gases ionizes and oxidizes the organic compounds in the photoresist, which are then drawn away from the ashing chamber as effluents in the exhaust gas.

The plasma ashing also tends to passivate the exposed surface of certain deposited layers. For example, an oxygen plasma passivates the exposed surface of an aluminum deposited layer according to the reaction:

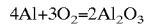

By further example, an ozone plasma passivates the exposed surface of an aluminum deposited layer according to the reaction:

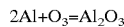

The step of applying the tetra methyl ammonium hydroxide as in step 22 is a key element of the present invention. During this step, the tetra methyl ammonium hydroxide reacts with any halogens, such as chlorine, that remain on the surface of the wafer from the etching process of step 18. For the specific example of chlorine, and without being bound by specific theory, the reaction proceeds according to the equation:

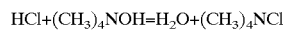

Thus, according to the equation given above, the chlorine is neutralized in a relatively stable compound that can then be removed during the rinse 24.

The tetra methyl ammonium hydroxide can be applied to the integrated circuit in an aqueous solution, such as by dipping, spraying, or swabbing. In a preferred embodiment the molar concentration of tetra methyl ammonium hydroxide in the aqueous solution is between about 0.0001 and about 2. The pH of the aqueous solution is preferably between about 7.1 and about 14. In an alternate embodiment the integrated circuit is exposed to the tetra methyl ammonium hydroxide in a gaseous form, such as by evaporating an amount of tetra methyl ammonium hydroxide in a dry, inert carrier gas, evaporating a liquid source of tetra methyl ammonium hydroxide, or drawing off a vapor pressure of a liquid source of tetra methyl ammonium hydroxide in a vacuum. In a most preferred embodiment, the step of applying the tetra methyl ammonium hydroxide is immediately followed by a rinse step 24, where the integrated circuit is rinsed with water, such as filtered and deionized water.

Certain of the steps as depicted in FIG. 1 are enclosed within a boundary 11, which boundary indicates that these steps may be performed within one or more chambers of a multichamber wafer processing tool. For example, the etch step 18 can be accomplished in a first of the chambers, the photoresist strip step 20 can be accomplished in a second of the chambers, and the tetra methyl ammonium hydroxide application step 22 and rinse step 24 can be accomplished in a third of the chambers. Alternately, the etch step 18 can be accomplished in a first of the chambers, the tetra methyl ammonium hydroxide application step 22 and rinse step 24 can be accomplished in a second of the chambers, and the photoresist strip step 20 can be accomplished in a third of the chambers.

In yet a further embodiment, the rinse step 24 can be accomplished in a fourth of the chambers that is a separate chamber from the chamber in which the tetra methyl ammonium hydroxide is applied. As described above, the rinse step 24 is preferably accomplished immediately after the application of the tetra methyl ammonium hydroxide application, regardless of whether the photoresist strip step 20 is performed before or after the application of the tetra methyl ammonium hydroxide application.

An optional solvent strip step 26 is accomplished to further clean any residual contaminants off the integrated circuit, such as reaction byproducts, either from the neutralization reactions or the ashing of the photoresist. Thus, the method as described above is inclusively a method for etching a surface of an integrated circuit, a method for removing halogens such as chlorine from the surface of an integrated circuit, and a method for inhibiting corrosion within a metallization system of an integrated circuit. Further, even if all of the reaction products of the application of the tetra methyl ammonium hydroxide are not removed during the processing, the tetra methyl ammonium hydroxide neutralizes the chlorine, and prevents it from causing the problems described above.

Figure 2:
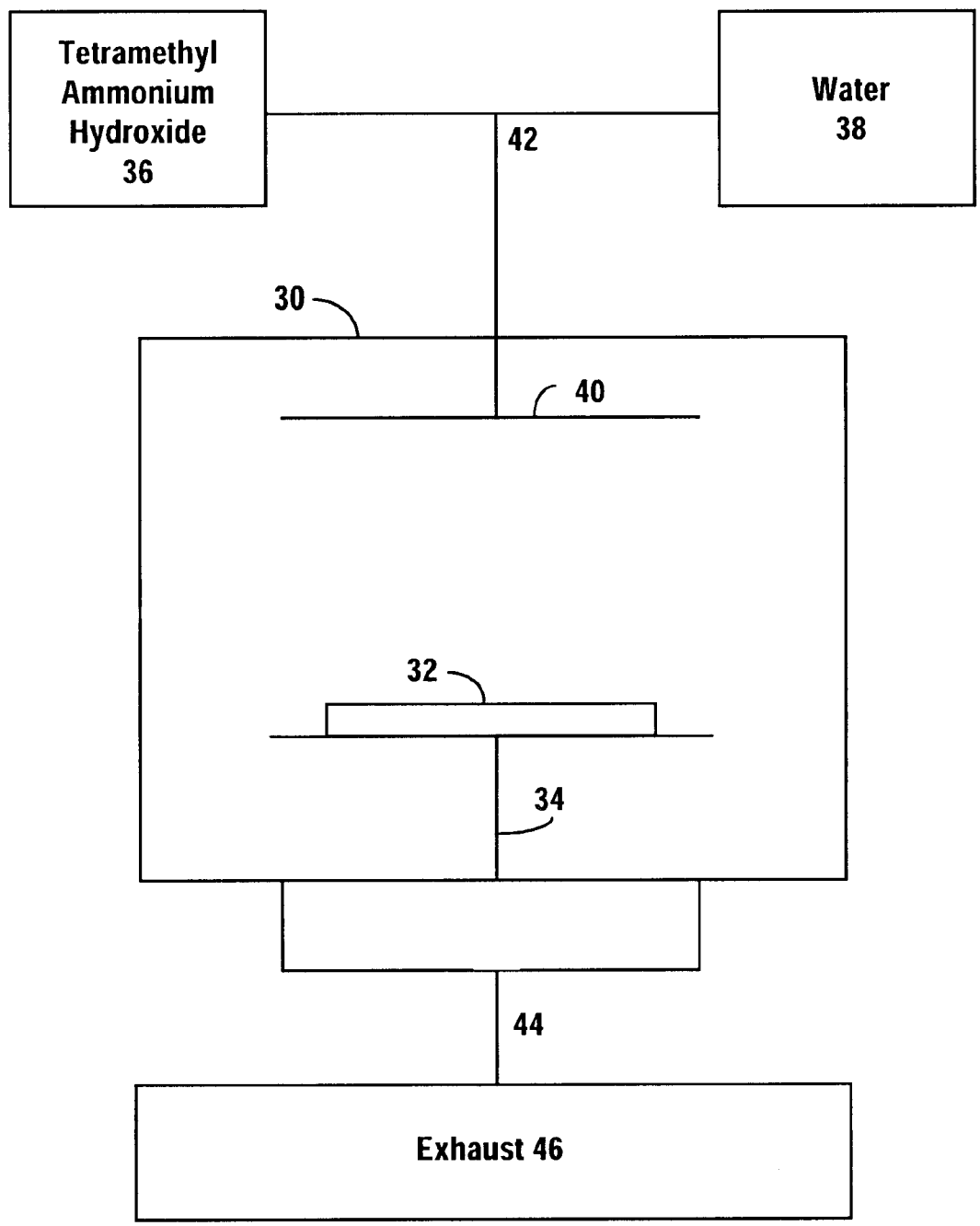
FIG. 2 is a functional schematic diagram of a chamber for exposing an integrated circuit to the tetra methyl ammonium hydroxide.

FIG. 2 depicts a functional representation of a tool 28 in which a process, such as the application of the tetra methyl ammonium hydroxide, can be accomplished. In the embodiment depicted in FIG. 2, the tetra methyl ammonium hydroxide is applied as either an aqueous mixture or a gas from a source of tetra methyl ammonium hydroxide 26. The tetra methyl ammonium hydroxide is delivered to the chamber 30 via lines 42, and distributed through a shower head plenum 40 onto the wafer 32, which contains the integrated circuits. The wafer 32 is disposed on a chuck 34, that holds and selectively heats and rotates the wafer 32. After the wafer 32 has been exposed to the tetra methyl ammonium hydroxide, the wafer 32 is preferably rinsed with water from the water source 38. The reaction byproducts are drawn away to the exhaust 46 through the lines 44.

In a preferred embodiment of the invention where an aqueous source of tetra methyl ammonium hydroxide is used, the wafer 32 is exposed to a flow of the solution for between about 5 seconds and about 60 seconds while the wafer 32 spins at a rate of between about 0 rpm and about 1,000 rpm. The wafer 32 is then rinsed with water for between about 10 seconds and about 120 seconds while the wafer 32 spins at a rate of between about 100 rpm and about 1,000 rpm.

It is appreciated that the invention as described above comprehends numerous adaptations, rearrangements, and substitutions of parts, all of which are considered to be within the scope and spirit of the invention as described, and that the scope of the invention is only to be restricted by the language of the claims given below.

What is claimed is:

1. A method for etching a surface of an integrated circuit, comprising the sequential steps of:

applying a layer of photoresist to the surface of the integrated circuit, exposing the layer of photoresist on the surface of the integrated circuit, developing the layer of photoresist on the surface of the integrated circuit, etching the surface of the integrated circuit with an etchant that contains chlorine, exposing the surface of the integrated circuit to a mixture consisting essentially of tetra methyl ammonium hydroxide to neutralize the chlorine, and rinsing the surface of the integrated circuit with water.

2. The method of claim 1 wherein the step of exposing the surface of the integrated circuit to tetra methyl ammonium hydroxide to neutralize the chlorine further comprises rinsing the surface of the integrated circuit with an aqueous solution of tetra methyl ammonium hydroxide.

3. The method of claim 2 wherein the aqueous solution of tetra methyl ammonium hydroxide has a molar concentration of between about 0.0001 and about 2.

4. The method of claim 2 wherein the aqueous solution of tetra methyl ammonium hydroxide has a pH of between about 7.1 and about 14.

5. The method of claim 1 wherein the step of exposing the surface of the integrated circuit to tetra methyl ammonium hydroxide to neutralize the chlorine further comprises exposing the surface of the integrated circuit to a gas containing tetra methyl ammonium hydroxide.

6. The method of claim 1 further comprising the step of removing the layer of photoresist from the surface of the integrated circuit.

7. The method of claim 6 wherein the step of removing the layer of photoresist from the surface of the integrated circuit is performed prior to the step of exposing the surface of the integrated circuit to tetra methyl ammonium hydroxide to neutralize the chlorine.

8. The method of claim 6 wherein the step of removing the layer of photoresist from the surface of the integrated circuit is performed concurrently with the step of exposing the surface of the integrated circuit to tetra methyl ammonium hydroxide to neutralize the chlorine.

9. The method of claim 6 wherein the step of removing the layer of photoresist from the surface of the integrated circuit is performed prior to the step of rinsing the surface of the integrated circuit with water.

10. The method of claim 6 wherein the step of removing the layer of photoresist from the surface of the integrated circuit further comprises ashing the layer of photoresist in an oxygen plasma.

11. The method of claim 6 wherein the step of removing the layer of photoresist from the surface of the integrated circuit further comprises ashing the layer of photoresist in an ozone plasma.

12. The method of claim 1 wherein the steps of etching the surface of the integrated circuit, exposing the surface of the integrated circuit to tetra methyl ammonium hydroxide to neutralize the chlorine, and rinsing the surface of the integrated circuit with water are performed in separate chambers of a multichamber processing tool.

13. The method of claim 1 wherein the steps of exposing the surface of the integrated circuit to tetra methyl ammonium hydroxide to neutralize the chlorine and rinsing the surface of the integrated circuit with water are performed in the same chamber of a multichamber tool.

14. The method of claim 1 further comprising the step of rinsing the surface of the integrated circuit with a solvent after the step of rinsing the surface of the integrated circuit with water.

15. A method for removing chlorine from a surface of an integrated circuit comprising the steps of:

exposing the surface of the integrated circuit to a mixture consisting essentially of tetra methyl ammonium hydroxide to neutralize the chlorine, and rinsing the surface of the integrated circuit with water.

16. The method of claim 15 wherein the step of exposing the surface of the integrated circuit to tetra methyl ammonium hydroxide to neutralize the chlorine further comprises rinsing the surface of the integrated circuit with an aqueous solution of tetra methyl ammonium hydroxide.

17. The method of claim 15 wherein the step of exposing the surface of the integrated circuit to tetra methyl ammonium hydroxide to neutralize the chlorine further comprises exposing the surface of the integrated circuit to a gas containing tetra methyl ammonium hydroxide.

18. A method for inhibiting corrosion within a metallization system of an integrated circuit, where the metallization system has been etched with a chlorine-containing composition, comprising the steps of:

exposing the metallization system of the integrated circuit to a mixture consisting essentially of tetra methyl ammonium hydroxide to neutralize the chlorine, and rinsing the metallization system of the integrated circuit with water.

19. The method of claim 18 wherein the step of exposing the surface of the integrated circuit to tetra methyl ammonium hydroxide to neutralize the chlorine further comprises rinsing the surface of the integrated circuit with an aqueous solution of tetra methyl ammonium hydroxide.

20. The method of claim 18 wherein the step of exposing the surface of the integrated circuit to tetra methyl ammonium hydroxide to neutralize the chlorine further comprises exposing the surface of the integrated circuit to a gas containing tetra methyl ammonium hydroxide.

* * * * *